United States Patent
Shin

(10) Patent No.: US 7,099,693 B2
(45) Date of Patent: Aug. 29, 2006

(54) MOBILE COMMUNICATION TERMINAL AND METHOD FOR WARNING A USER OF A LOW-VOLTAGE STATE OF THE SAME

(75) Inventor: Dong-Soo Shin, Suwon-shi (KR)

(73) Assignee: Samsung Electronics Co., Ltd., (KR)

( * ) Notice: Subject to any disclaimer, the term of this patent is extended or adjusted under 35 U.S.C. 154(b) by 152 days.

(21) Appl. No.: 10/822,104

(22) Filed: Apr. 9, 2004

(65) Prior Publication Data

US 2004/0214613 A1    Oct. 28, 2004

(30) Foreign Application Priority Data

Apr. 23, 2003    (KR) ................. 10-2003-0025757

(51) Int. Cl.
*H04M 1/00*    (2006.01)
(52) U.S. Cl. .............. 455/557; 455/573; 455/567; 455/412.2; 455/574; 455/407; 455/412.1; 455/413; 455/418; 455/425
(58) Field of Classification Search ........... 455/523, 455/562, 522, 412.2, 524, 402, 412.1, 413, 455/418, 425, 552
See application file for complete search history.

(56) References Cited

U.S. PATENT DOCUMENTS 6,236,326 B1    5/2001  Murphy

FOREIGN PATENT DOCUMENTS

JP    409130284 A  *  5/1997
JP    2002320261 A  *  10/2002

* cited by examiner

*Primary Examiner*—Joseph Feild
*Assistant Examiner*—David Q. Nguyen
(74) *Attorney, Agent, or Firm*—Dilworth & Barrese LLP

(57) ABSTRACT

A mobile communication terminal and a method for warning a user of a low-voltage state of the terminal. The method includes the steps of pre-storing a low-voltage alarm message in a memory, checking a voltage level of a battery in a call connection mode, and if the voltage level of the battery is lower than a predetermined voltage, reading the low-voltage alarm message from the memory and transmitting the read low-voltage alarm message to a called terminal communicating with the mobile communication terminal. A caller mobile communication terminal can thus inform a called mobile communication terminal that the breaking of a call connection state was caused by a low-voltage state of a battery of the caller terminal.

13 Claims, 4 Drawing Sheets

MOBILE COMMUNICATION TERMINAL AND METHOD FOR WARNING A USER OF A LOW-VOLTAGE STATE OF THE SAME

PRIORITY

This application claims priority to an application entitled "MOBILE COMMUNICATION TERMINAL AND METHOD FOR WARNING OF LOW-VOLTAGE OF THE SAME", filed in the Korean Industrial Property Office on Apr. 23, 2003 and assigned Ser. No. 2003-25757, the contents of which are hereby incorporated by reference.

BACKGROUND OF THE INVENTION

1. Field of the Invention

The present invention relates to a mobile communication terminal, and more particularly to a mobile communication terminal for indicating a low-voltage state of its own battery and a method for warning a user of the low-voltage state of the mobile communication terminal.

2. Description of the Related Art

FIG. 1 is a flow chart illustrating a method for warning a user of a low-voltage state of a conventional mobile communication terminal. Referring to FIG. 1, a mobile communication terminal checks a power-supply voltage of a battery at step 100, and determines at step 101 whether the battery is reduced to a power-supply cut-off voltage level. If it is determined at step 101 that the battery is not reduced to a power-supply cut-off voltage level, the mobile communication terminal determines at step 102 whether the battery is reduced to a low-voltage state. If a low-voltage state is found, a user of the mobile communication terminal cannot establish a call connection state with a called party, though the user can perform simple operations such as a phone number search on the mobile communication terminal. However, if the battery is reduced to a power-supply cut-off voltage level, the user cannot search for a desired phone number on his or her mobile communication terminal. If it is determined at step 102 that the mobile communication terminal is in a low-voltage state, it is determined at step 103 whether the mobile communication terminal is communicating with a terminal of a called party. Different display intervals of an alarm message are set up depending on the determination result at step 103. If the mobile communication terminal is communicating a called party, a warning timer is driven in a call connection state at step 104, and an information screen indicating the low-voltage state of the battery is displayed on a display of the mobile communication terminal while a speaker outputs an alarm sound at step 105. Then, if the battery reaches a power-supply cut-off voltage, the mobile communication terminal is powered off. However, if the mobile communication terminal is not communicating with a called party, a warning timer is driven in a wait mode at step 106, and an information screen indicating the low-voltage state of the battery is displayed on a display of the mobile communication terminal while a speaker outputs an alarm sound at step 107. A conventional mobile communication terminal consumes ten times more power in the call connection mode than in the wait mode, and therefore in a call connection mode it uses a warning timer to warn of a short time remaining in operation. The mobile communication terminal is then compulsorily powered off after the lapse of a predetermined time.

If the battery is reduced to a power-supply cut-off voltage level at step 101, the mobile communication terminal determines whether a power-supply cut-off flag is set up at step 108. The power-supply cut-off flag indicates that a voltage level of the mobile communication terminal has reached a power-supply cut-off voltage level. If it is determined at step 108 that the power-supply cut-off flag is set, a timer for powering off the mobile communication terminal is driven. Therefore, the mobile communication terminal stops communicating with the called party after the lapse of a predetermined time at step 109, and is then powered off at step 110. However, if the voltage supplied to the mobile communication terminal is determined to be the power-supply cut-off voltage level at step 101, and the power-supply cut-off flag is determined to not be set at step 108, then the power-supply cut-off flag is set at step 111, and a timer for powering off the mobile communication terminal is driven at step 112.

In this way, the conventional mobile communication terminal drives a timer for a predetermined time after sensing a low-voltage state of the battery, and outputs an alarm sound indicating the low-voltage state at predetermined intervals. The mobile communication terminal is then powered off after the lapse of the predetermined time.

Conventional mobile communication terminals enable a user, i.e. caller, to recognize an alarm sound signaling a low-voltage state, but are unable to allow a called party to recognize the alarm sound signaling a low-voltage state. The called party is then unable to recognize the reason for the call termination; specifically, the called party cannot recognize whether the caller intentionally powered off the mobile communication terminal or whether the battery in the caller's mobile communication terminal is consumed. This remains the case even if the called party receives information indicating a power-off state of the caller's mobile communication terminal. As a result, the called party may continuously attempt to establish a call connection state with the caller. Further, if the caller does not carry a spare battery, he or she cannot inform the called party of this situation.

SUMMARY OF THE INVENTION

Therefore, the present invention has been made in view of the above problems. It is an object of the present invention to provide a mobile communication terminal for informing a called mobile communication terminal of information indicating that the breaking of a call connection state between a caller and a called party is due to a low-voltage state of a battery, and a method for warning of the low-voltage state.

In accordance with one aspect of the present invention, the above and other objects can be accomplished using a method for warning a user of a low-voltage state of a mobile communication terminal, comprising the steps of: a) prestoring a low-voltage alarm message in a memory; b) checking a voltage level of a battery in a call connection mode; and c) if the voltage level of the battery is lower than a predetermined voltage, reading the low-voltage alarm message from the memory, and transmitting the read low-voltage alarm message to a called terminal communicating with the mobile communication terminal.

In accordance with another aspect of the present invention, there is provided a mobile communication terminal apparatus, comprising: a voltage detector for detecting a battery voltage; a low-voltage message storage unit for storing a low-voltage alarm message therein; and a controller for transmitting the low-voltage alarm message to a called terminal when the battery voltage is lower than a predetermined voltage.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
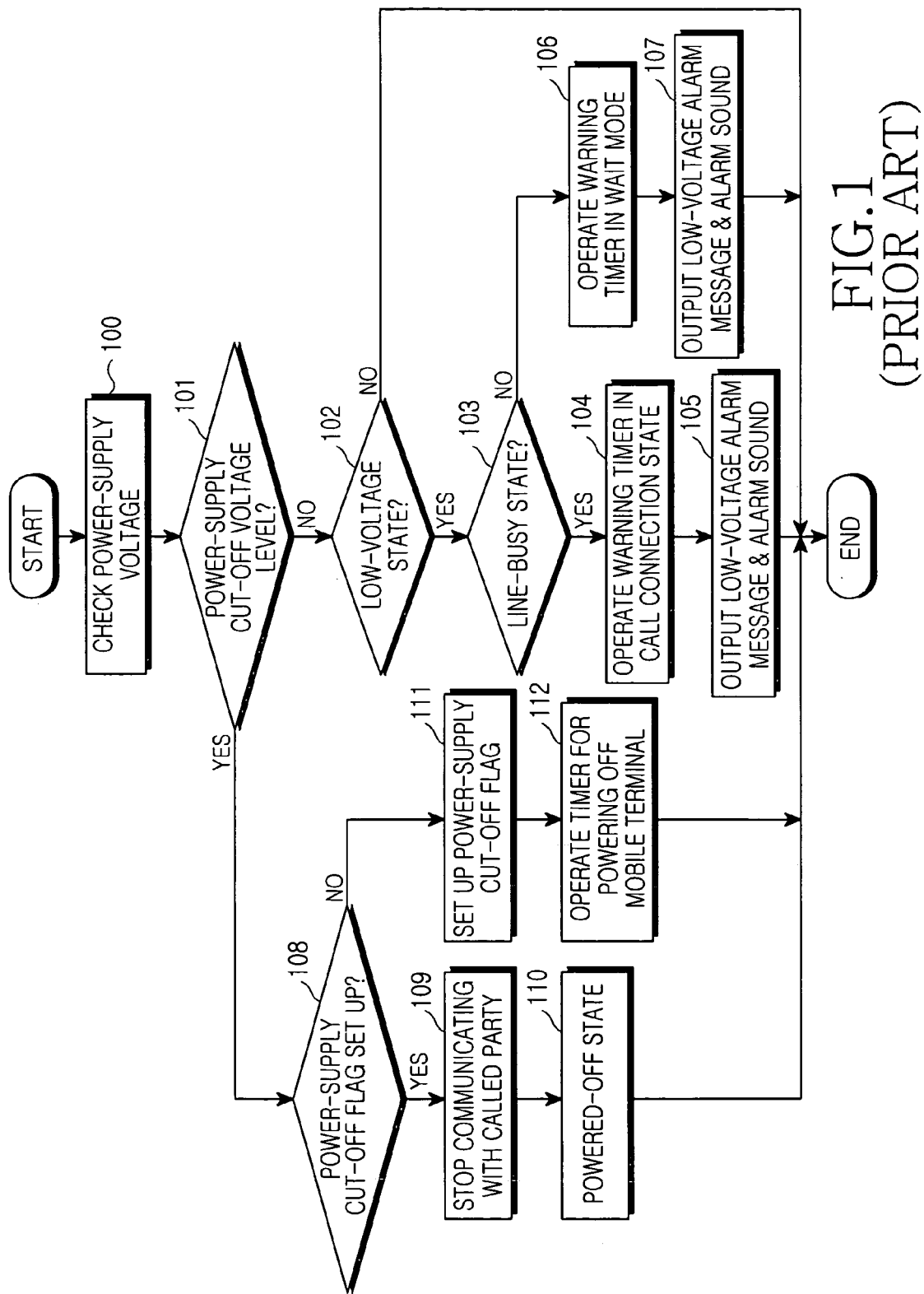
FIG. 1 is a flow chart illustrating a method for warning a user of a low-voltage state of a conventional mobile communication terminal.

Preferred embodiments of the present invention will be described below in detail with reference to the attached drawings. In the drawings, the same or similar elements are denoted by the same reference numerals even though they are depicted in different drawings. In the following description, a detailed description of known functions and configurations incorporated herein will be omitted when it may make the subject matter of the present invention unclear.

Figure 2:
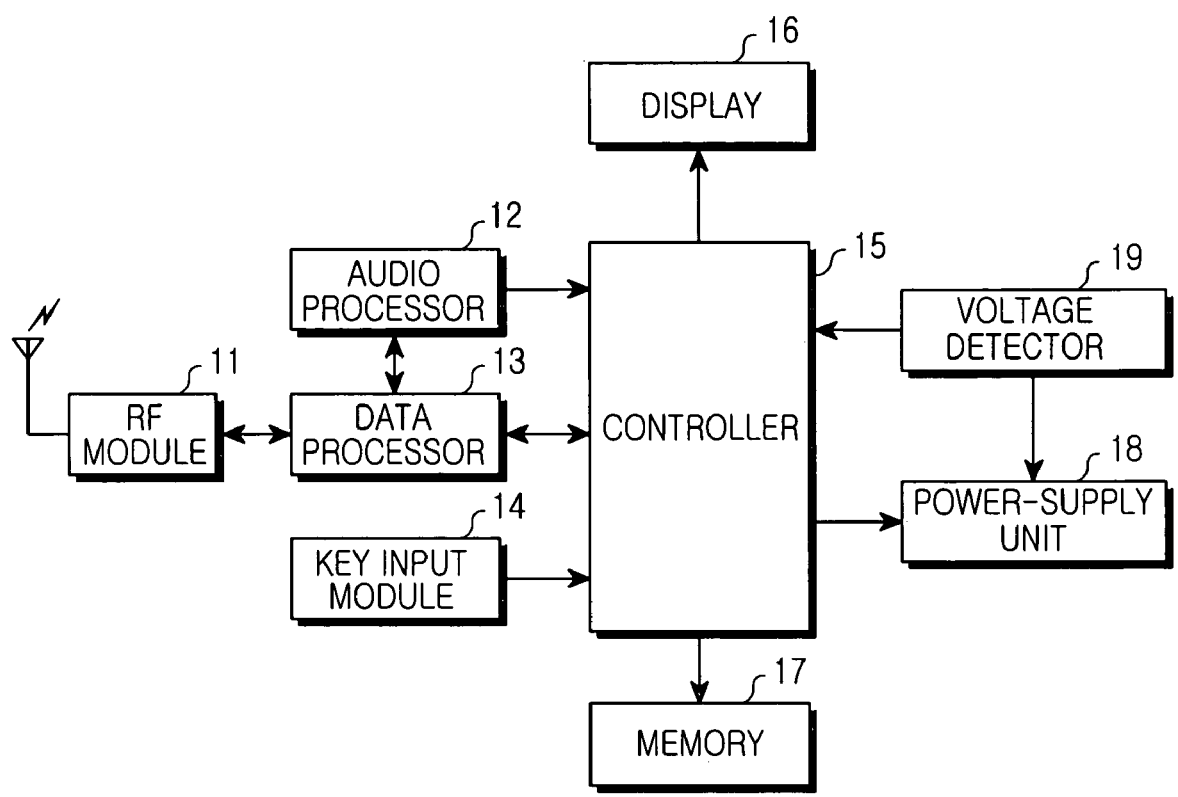
FIG. 2 is a block diagram illustrating a mobile communication terminal in accordance with a preferred embodiment of the present invention.

FIG. 2 is a block diagram illustrating a mobile communication terminal in accordance with a preferred embodiment of the present invention. Referring to FIG. 2, a mobile communication terminal includes a RF (Radio Frequency) module 11 for transmitting and receiving RF signals over an antenna, a data processor 13 connected to the RF module 11 for processing audio or data signal communicating with the RF module 11, and an audio processor 12 for processing audio signals generated by the data processor 13. The mobile communication terminal further includes a display 16; and a power-supply unit 18 with a battery for providing, for example, the RF module 11, the data processor 13, the audio processor 12, and the display 16 with a power-supply voltage; a voltage detector 19 for detecting a voltage level state of the power-supply unit 18; a memory 17 for storing therein a low-voltage alarm message; and a controller 15 for controlling overall operations of the mobile communication terminal. The controller 15 functions as a CPU (Central Processing Unit). The RF module 11 performs a wireless communication function of the mobile communication terminal. The display 16 displays user data generated from the controller 15.

A key input module 14 includes a plurality of number and character information keys, up and down arrow keys, and a plurality of function keys for selecting from a variety of functions.

The memory 17 also stores a SMS (Short Message Service) message and a Voice OGM (Voice Out-Going Message) message which indicate a low-voltage state of the battery, as well as, for example, other SMS messages generated from the mobile communication terminal, and phone numbers. The memory 17 further includes setup information for determining whether the mobile communication terminal should output a low-voltage alarm message, and for determining whether the mobile communication terminal should output the low-voltage alarm message by means of either a SMS message or a voice message.

The controller 15 determines whether the power-supply unit 18 is in the low-voltage state. If the power-supply unit 18 is in the low-voltage state when the mobile communication terminal is communicating with a called party, then either a SMS message serving as a low-voltage alarm message is transmitted over a paging channel, or a Voice OGM message serving as a low-voltage alarm message is transmitted to the called mobile communication terminal over an open traffic channel used for voice transmission and reception. If the low-voltage alarm message is transmitted using a SMS message, the controller 15 receives an acknowledgment message from a base station which it uses to determine whether message transmission was successfully completed. If it is determined that the message transmission was successfully completed, then the controller 15 controls the display 16 to display information indicating successful message transmission.

Figure 3:
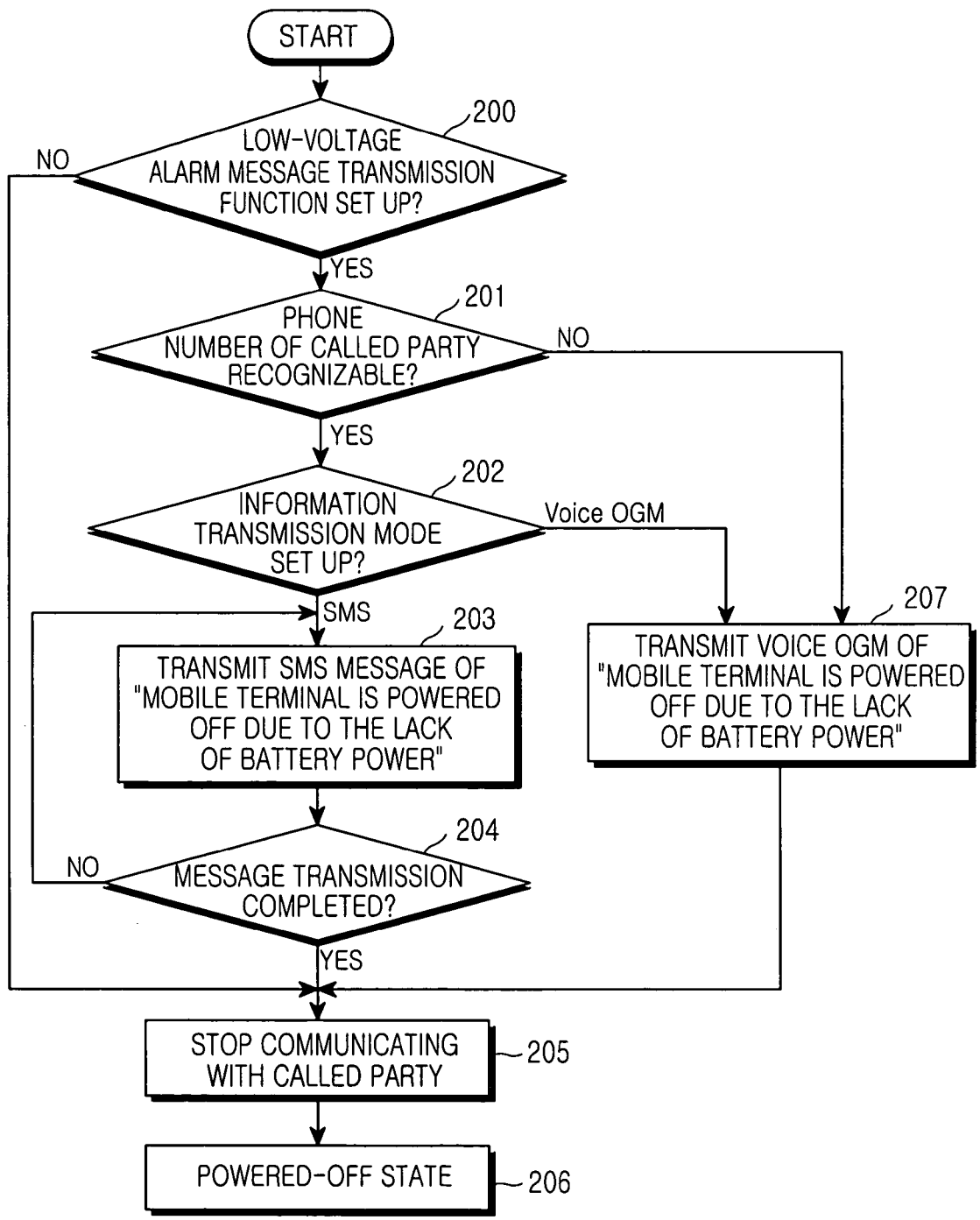
FIG. 3 is a flow chart illustrating a method for warning a user of a low-voltage state of the mobile communication terminal in accordance with a preferred embodiment of the present invention.

As shown in FIG. 1 disclosing the conventional method for warning a user of a low-voltage state of a mobile communication terminal, prior to performing step 109 but after performing step 108, the mobile communication terminal further performs a plurality of message transmission steps, as shown in FIG. 3, for transmitting a prescribed message indicating the low-voltage state to the called mobile communication terminal. A person using the called mobile communication terminal can thus recognize the reason for a sudden call interruption.

FIG. 3 is a flow chart illustrating a method for warning a user of a low-voltage state of the mobile communication terminal in accordance with a preferred embodiment of the present invention. Referring to FIG. 3, the controller 15 checks a state of the memory 17, such that it determines at step 200 whether a terminal setup menu for indicating low-voltage alarm message transmission to the called mobile communication terminal is set up. If it is determined at step 200 that the low-voltage alarm message transmission is set up, then the controller 15 determines whether a phone number of the called mobile communication terminal is recognizable at step 201. If the called mobile communication terminal is recognizable by the controller 15 at step 201, the controller 15 checks a state of the memory 17 to determine at step 202 whether the information transmission mode used to transmit a low-voltage alarm message is set to a SMS mode or a Voice OGM mode. The function of step 202 can be implemented by, for example, adding a transmission mode setup icon of the low-voltage alarm message to a UI (User Interface) menu adapted to set up a variety of functions of a mobile communication terminal, or by installing an additional key to the key input module 14. If it is determined at step 202 that a SMS message transmission mode is set up, the controller 15 reads a SMS message indicating a low-voltage state from the memory 17, for example, "Mobile terminal is powered off due to the lack of battery power", and transmits the read SMS message to the called mobile communication terminal at step 203. Then, the controller 15 receives an acknowledgment message from the base station which is used at step 204 to determine whether the low-voltage alarm message was successfully transmitted to the called mobile communication terminal. If it is determined at step 204 that the low-voltage alarm message was successfully transmitted, the controller 15 controls the mobile communication terminal to stop communicating with the called mobile communication terminal at step 205, and then powers off the mobile communication terminal at step 206. However, if it is determined at step 204 that the controller 15 failed to transmit the low-voltage alarm message to the called mobile communication terminal, the method returns to step 203 to retransmit the SMS message to the called mobile communication terminal.

Provided that a current call connection state is a group call, the low-voltage alarm message can also be transmitted by means of a broadcast mail to a plurality of called persons communicating with the caller.

If it is determined at step 202 that an information provision mode of the memory 17 is set to the Voice OGM message, the controller 15 reads a prescribed Voice OGM message from the memory 17, for example, "Mobile terminal is powered off due to the lack of battery power", at step 207, and then informs the called mobile communication terminal of the low-voltage state over an open traffic channel by sending the prescribed Voice OGM message.

If the controller 15 is unable to recognize a phone number of the called party at step 201 because, for example, a caller ID service for displaying a phone number of a called mobile communication terminal is not set up or a user of the caller mobile communication terminal sets up a function for preventing a caller ID from being displayed, the controller 15 reads Voice OGM data of "Mobile terminal is powered off due to the lack of battery power" from the memory 17, and transmits this Voice OGM data over an open traffic channel.

A method for transmitting a low-voltage alarm message of "Mobile terminal is powered off due to the lack of battery power" to the called mobile communication terminal is described below with reference to FIG. 4 with the assumption that the called phone number is a domestic phone number, an international phone number, a mobile communication phone number, or a fixed line phone number.

Figure 4:
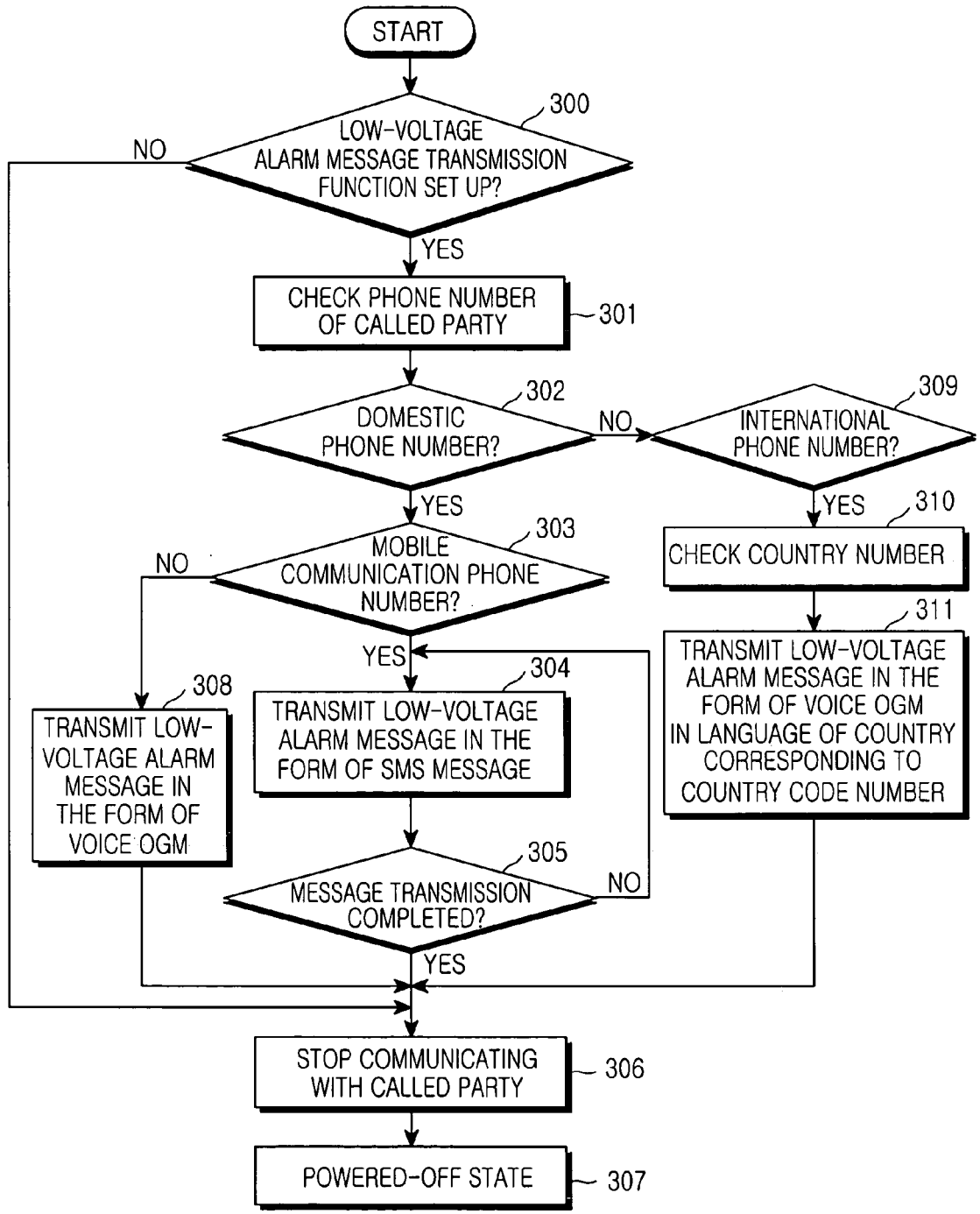
FIG. 4 is a flow chart illustrating a method for warning a user of a low-voltage state of the mobile communication terminal according to a calling phone number in accordance with a preferred embodiment of the present invention.

FIG. 4 is a flow chart illustrating a method for warning a user of a low-voltage state of a counterpart mobile communication terminal according to a called or calling phone number in accordance with a preferred embodiment of the present invention. For the convenience of description and better understanding of the present invention, the Voice OGM or SMS message of "Mobile terminal is powered off due to the lack of battery power" will be referred to as a low-voltage alarm message. Referring to FIG. 4, the controller 15 checks a state of the memory 17 to determine at step 300 whether a terminal setup menu for indicating low-voltage alarm message transmission to the called mobile communication terminal is set up. If it is determined at step 300 that the low-voltage alarm message transmission is set up, then the controller 15 determines at step 301 whether a phone number of a counterpart mobile communication terminal is a domestic phone number or an international phone number. In the case where a user generates an outgoing call signal using his or her communication terminal, a phone number entered by the user on his or her communication terminal is stored in the memory; the controller 15 will then check the phone number as stored in the memory of the user's mobile communication terminal to determine the nature of the other terminal's phone number. In the case where the user receives an incoming call signal from another terminal, the controller 15 uses the caller ID or phone number using a caller ID display service function to determine the nature of the other terminal's phone number. If it is determined at step 302 that the phone number of the counterpart mobile terminal is a domestic phone number, then the controller 15 determines at step 303 whether the phone number of the counterpart mobile terminal is a mobile communication phone number starting with a prescribed number such as '011' or '016' or a fixed line phone number starting with a local phone number such as '02' or '031'. If it is determined at step 303 that the phone number of the counterpart terminal is a mobile communication phone number, then a SMS message indicating a low-voltage alarm message is transmitted to the counterpart terminal at step 304. The controller 15 determines at step 305 whether the SMS message transmission was successfully completed or not. If it is determined at step 305 that the SMS message transmission has been successfully completed, the controller 15 controls the mobile communication terminal to stop communicating with the counterpart terminal at step 306, and then powers off the mobile communication terminal at step 307. If it is determined at step 305 that the SMS message transmission failed, the method repeats step 304 and retransmit the SMS message. If it is determined at step 303 that the phone number of the counterpart terminal is a wire communication phone number, then the controller 15 reads a Voice OGM message stored in the memory 17 at step 308, and transmits the Voice OGM message to the counterpart terminal through an open traffic channel to inform the counterpart terminal of the low-voltage state of the caller mobile communication terminal.

If it is determined at step 309 on the basis of the received information from step 301 that a phone number of the counterpart terminal is an international phone number, the controller 15 determines at step 310 which country the international phone number corresponds to. Upon receiving the result information from step 310, the controller 15 transmits a Voice OGM message in a language of a country corresponding to the international phone number as a low-voltage alarm message at step 311. In this case, it is desirable that the memory of the mobile communication terminal stored a low-voltage alarm message formatted in the language of the country corresponding to the international phone number of the counterpart terminal prior to the call.

As apparent from the above description, in the case where a mobile communication terminal is powered off due to its battery's low-voltage state while in communication with a called party, the caller's mobile communication terminal transmits to the counterpart mobile communication terminal a low-voltage alarm message through an open traffic channel, using a SMS or Voice OGM message, just prior to powering off. The low-voltage alarm message indicates that the caller terminal's power-off state is caused by the caller terminal's lack of battery power. This enables the user of the counterpart mobile communication terminal to immediately recognize the reason for the call interruption.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for warning a user of a low-voltage state of a mobile communication terminal, comprising the steps of:
   a) pre-storing a Short Message Service (SMS) or Out-Going Message (Voice OGM) low-voltage alarm message in a memory;
   b) checking a voltage level of a battery in a call connection mode; and
   c) if the voltage level of the battery is lower than a predetermined voltage, reading the low-voltage alarm message from the memory, transmitting the read low-voltage alarm message to a called terminal communicating with the mobile communication terminal, and selecting one of the SMS message and the Voice OGM;

if the SMS message is selected, transmitting the low-voltage alarm message to the called mobile communication terminal using the SMS message; and if the Voice OGM is selected, transmitting the Voice OGM to the called terminal through a traffic channel.

2. The method as set forth in claim 1, wherein step (c) includes the steps of:

recognizing a phone number of the called terminal; and transmitting the low-voltage alarm message using an SMS message.

3. The method as set forth in claim 1, wherein the low-voltage alarm message is a Voice OGM.

4. The method as set forth in claim 1, wherein step (c) further includes the steps of:

recognizing a phone number of the called terminal; and if the phone number of the called terminal is not recognized, selecting the Voice OGM to be the low-voltage alarm message.

5. The method as set forth in claim 1, wherein step (c) includes the steps of:

recognizing a phone number of the called terminal;

determining whether the phone number of the called terminal is a mobile communication phone number or a fixed line phone number; and if the phone number of the called terminal is a mobile communication phone number, transmitting the SMS message to the called terminal as the low-voltage alarm message.

6. The method as set forth in claim 5, wherein step (c) further includes the step of:

if the phone number of the called terminal is determined to be a fixed line phone number, transmitting the Voice OGM as the low-voltage alarm message to the called terminal through a traffic channel.

7. The method as set forth in claim 1, further comprising the step of:

d) after transmitting the low-voltage alarm message, cutting off a voltage received from the battery.

8. The method as set forth in claim 1, further comprising the step of:

previously preparing a Voice OGM written in languages of a plurality of countries as the low-voltage alarm message, and wherein step (c) includes the steps of:

recognizing a phone number of the called terminal;

determining whether the phone number of the called terminal is a domestic phone number or an international phone number; and if the phone number of the called terminal is an international phone number, reading from the memory a Voice OGM in a language of a country corresponding to the international phone number as the low-voltage alarm message, and transmitting the read Voice OGM over a traffic channel.

9. A mobile communication terminal apparatus, comprising:

a voltage detector for detecting a battery voltage;

a message storage unit for storing a low-voltage alarm message therein; and a controller for transmitting the low-voltage alarm message to a called terminal when the battery voltage is lower than a predetermined voltage, wherein the controller determines whether a phone number of the called terminal is a mobile communication phone number or a fixed line phone number, transmits a Short Message Service (SMS) message as the low-voltage alarm message when the phone number of the called terminal is a mobile communication phone number, and transmits a Out-Going Message (Voice OGM) as the low-voltage alarm message when the phone number of the called terminal is a fixed line phone number.

10. The apparatus as set forth in claim 9, wherein the low-voltage alarm message is an SMS message.

11. The apparatus as set forth in claim 9, wherein the low-voltage alarm message is a Voice OGM.

12. The apparatus as set forth in claim 9, wherein the message storage unit stores a Voice OGM written in languages of a plurality of countries prior to a call, and the controller determines whether the phone number of the called terminal is a domestic phone number or an international phone number, reads a Voice OGM of a corresponding country from the memory storage unit if the phone number of the called terminal is determined to be an international phone number, and transmits the read Voice OGM as the low-voltage alarm message.

13. The apparatus as set forth in claim 9, wherein the controller transmits a Voice OGM as the low-voltage alarm message when a phone number of the called terminal is not recognized.

* * * * *